(12) United States Patent
Chen et al.

(10) Patent No.: US 9,654,146 B2
(45) Date of Patent: May 16, 2017

(54) BI-DIRECTIONAL PARITY BIT GENERATOR CIRCUIT

(71) Applicant: Taiwan Semiconductor Manufacturing Company, LTD., Hsinchu (TW)

(72) Inventors: Yi-Tzu Chen, Hsinchu (TW); Chien-Yuan Chen, Hsinchu (TW); Hau-Tai Shieh, Hsinchu (TW)

(73) Assignee: Taiwan Semiconductor Manufacturing Company, LTD., Hsinchu (TW)

( * ) Notice: Subject to any disclaimer, the term of this patent is extended or adjusted under 35 U.S.C. 154(b) by 21 days.

(21) Appl. No.: 14/829,059

(22) Filed: Aug. 18, 2015

(65) Prior Publication Data

US 2017/0054454 A1 Feb. 23, 2017

(51) Int. Cl.
*G06F 11/00* (2006.01)
*H03M 13/00* (2006.01)
*H03M 13/29* (2006.01)
*G06F 11/10* (2006.01)

(52) U.S. Cl.
CPC ......... *H03M 13/2906* (2013.01); *G06F 11/10* (2013.01)

(58) Field of Classification Search
CPC . H03M 13/2906; H03M 13/151; G06F 11/10; G06F 11/108; G06F 2211/1059; G06F 2211/1057; G06F 2211/1045; G06F 11/1048; G06F 11/1044; G06F 11/1028; G06F 11/1012; G06F 11/1008; G06F 11/1016; G11C 29/42; G11C 29/4401; G11C 29/44; G11C 2029/01
See application file for complete search history.

(56) References Cited

U.S. PATENT DOCUMENTS

| | | | | |
|---|---|---|---|---|
| 5,490,155 A | * | 2/1996 | Abdoo | G06F 11/1028 714/763 |
| 5,612,965 A | * | 3/1997 | Michaelson | G06F 11/1028 714/800 |
| 6,018,817 A | * | 1/2000 | Chen | G06F 11/1012 714/718 |
| 6,349,390 B1 | * | 2/2002 | Dell | G06F 11/106 714/6.24 |
| 7,587,658 B1 | * | 9/2009 | Tong | G06F 11/1012 714/763 |

(Continued)

*Primary Examiner* — Guerrier Merant
(74) *Attorney, Agent, or Firm* — Sterne, Kessler, Goldstein & Fox P.L.L.C.

(57) ABSTRACT

A parity bit generator module is disclosed that operates in a first direction or a second direction. In the first direction, the parity bit generator module generates parity bits for a first input datastream having information bits and combines these parity bits with the information bits of the input datastream to provide a first output datastream. Otherwise in a second direction, the parity bit generator module separates information bits from a second input datastream and generates parity bits from the information bits of the second input datastream to provide a second output datastream having the parity bits. In various exemplary embodiments, the bi-directional parity bit generator is implemented as part of an encoding/decoding module and/or an error-correcting code (ECC) data storage device.

18 Claims, 4 Drawing Sheets

(56) References Cited

U.S. PATENT DOCUMENTS

| | | | |
|---|---|---|---|
| 7,634,709 B2* | 12/2009 | Bauman | G06F 11/1044 714/767 |
| 8,605,523 B2 | 12/2013 | Tao et al. | |
| 8,630,132 B2 | 1/2014 | Cheng et al. | |
| 8,760,948 B2 | 6/2014 | Tao et al. | |
| 8,908,421 B2 | 12/2014 | Liaw | |
| 8,929,160 B2 | 1/2015 | Katoch et al. | |
| 8,964,492 B2 | 2/2015 | Hsu et al. | |
| 8,982,643 B2 | 3/2015 | Lum | |
| 9,117,510 B2 | 8/2015 | Yang et al. | |
| 9,208,858 B1 | 12/2015 | Lin et al. | |
| 9,218,872 B1 | 12/2015 | Liaw | |
| 2004/0083421 A1* | 4/2004 | Foss | G11C 15/00 714/805 |
| 2004/0177309 A1* | 9/2004 | Kreso | F02B 37/24 714/763 |
| 2008/0016392 A1* | 1/2008 | Earl | G06F 11/1048 714/6.12 |
| 2008/0201620 A1* | 8/2008 | Gollub | G06F 11/1044 714/718 |
| 2012/0215962 A1* | 8/2012 | Uhlaender | G11C 29/82 711/103 |
| 2012/0221926 A1* | 8/2012 | Blaum | G06F 11/108 714/770 |
| 2014/0153345 A1 | 6/2014 | Kim et al. | |
| 2014/0233330 A1 | 8/2014 | Ko et al. | |
| 2015/0348598 A1 | 12/2015 | Wang et al. | |
| 2015/0371702 A1 | 12/2015 | Wu et al. | |
| 2015/0380077 A1 | 12/2015 | Wu et al. | |
| 2015/0380078 A1 | 12/2015 | Liaw | |

* cited by examiner

BI-DIRECTIONAL PARITY BIT GENERATOR CIRCUIT

BACKGROUND

A computer, or a computer system having multiple computers, often includes one or more data storage devices for reading and/or writing information. In some situations, electrical or magnetic interference inside the computer and/or the computer system corrupts the information stored within the one or more data storage devices. Often times, the computer and/or the computer system includes one or more error-correcting code (ECC) data storage devices that detects and corrects the most common kinds of corruption. The one or more ECC data storage devices utilize one or more ECCs to add redundancy, in the form of one or more parity bits, to the information being written to the one or more ECC data storage devices. The redundancy is used to verify that the information being read from the one or more ECC data storage devices is consistent with the information that was previously written into the one or more ECC data storage devices. With the most common kinds of corruption, the redundancy is also be used to correct for inconsistencies between the information being read from the one or more ECC data storage devices and the information that was previously written into the one or more ECC data storage devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Overview

A parity bit generator module operates in a first direction or a second direction. In the first direction, the parity bit generator module generates parity bits for a first input datastream and combines these parity bits with information bits of the first input datastream to provide a first output datastream. Otherwise in a second direction, the parity bit generator module generates parity bits for information bits of a second input datastream and provides these parity bits as a second output datastream. In various exemplary embodiments, the parity bit generator module is implemented as part of an encoding/decoding module and/or an error-correcting code (ECC) data storage device.

Parity Bit Generator Module

Figure 1:
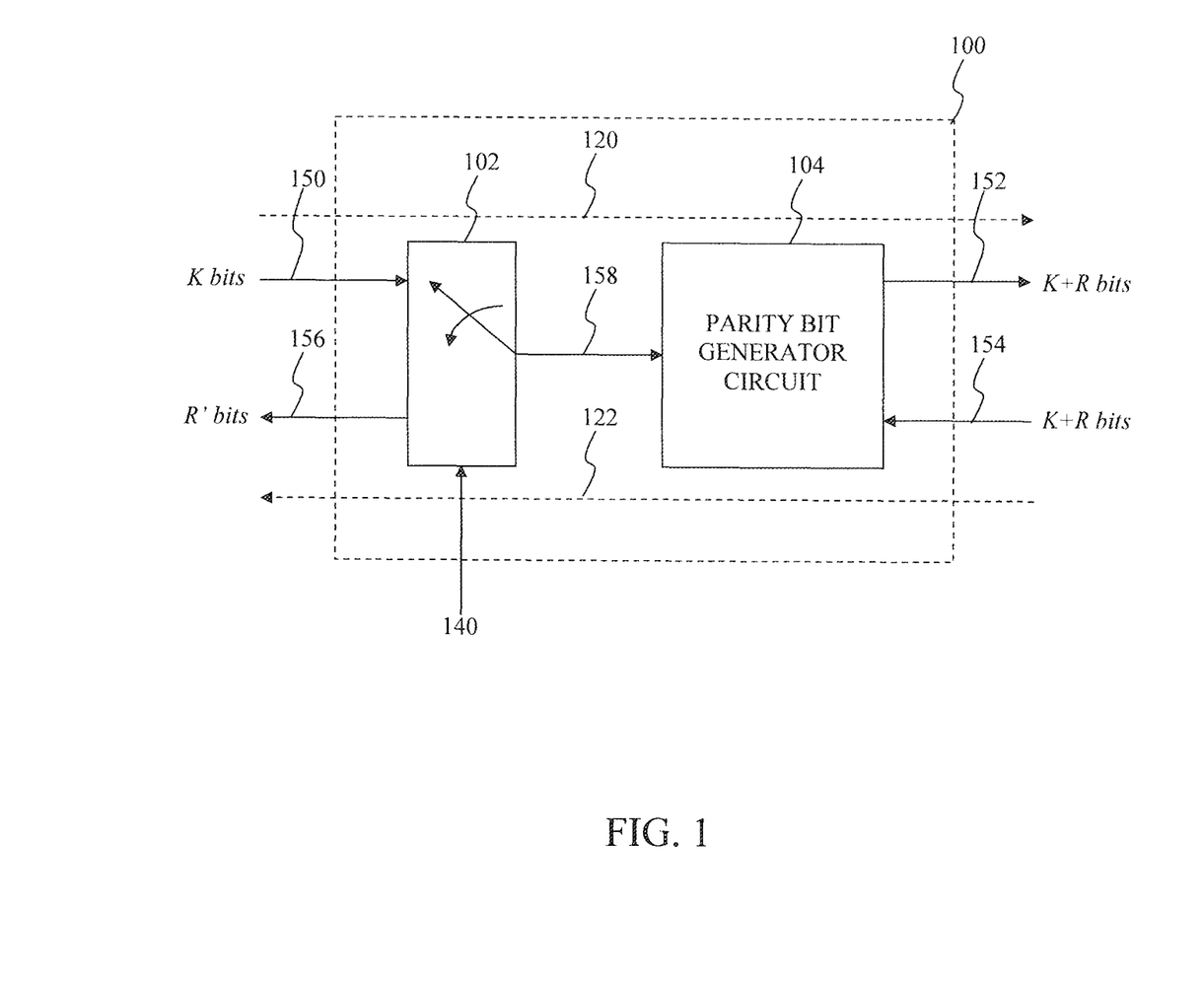
FIG. 1 is a block diagram of a parity bit generator module according to an exemplary embodiment of the present disclosure.

FIG. 1 is a block diagram of a parity bit generator module according to an exemplary embodiment of the present disclosure. A parity bit generator module 100 provides for a bi-directional generation of parity bits for one or more datastreams. As illustrated in FIG. 1, parity bit generator module 100 generates R parity bits for an input datastream 150 having K information bits and combines these R parity bits with the K information bits of input datastream 150 to provide an output datastream 152 having K+R bits in a first direction 120. Otherwise in a second direction 122, parity bit generator module 100 separates K information bits from an input datastream 154 having K+R bits and generates R' parity bits from the K information bits of the input datastream 154 to provide an output datastream 156 having R' parity bits. In an exemplary embodiment, parity bit generator module 100 operates in only one of the first direction 120 or the second direction 122 at a time.

Parity bit generator module 100 includes a bi-directional switch 102 and a parity bit generator circuit 104. As illustrated in FIG. 1, bi-directional switch 102 selects between first direction 120 and second direction 122 in response to a control signal 140. When control signal 140 is at a first value, such as a logical zero to provide an example, bi-directional switch 102 selects first direction 120 to couple input datastream 150 to parity bit generator circuit 104 via a bi-directional signaling pathway 158. Otherwise, when control signal 140 is at a second value, such as a logical one to provide an example, bi-directional switch 102 selects second direction 122 to couple parity bit generator circuit 104 to output datastream 156 via bi-directional signaling pathway 158.

Parity bit generator circuit 104 generates R parity bits from the K information bits of input datastream 150 when operating in first direction 120 in accordance with an ECC, such as a Hamming ECC code to provide an example. As an example, parity bit generator circuit 104 generates three parity bits from four information bits of input datastream 150 to provide seven bits of output datastream 152 in accordance with a Hamming (7,4) ECC code when operating in first direction 120. However, those of ordinary skill in the relevant art(s) will recognize that parity bit generator circuit 104 can use other block codes such as a Reed-Solomon ECC code, a Golay ECC code, a Bose, Chaudhuri, Hocquenghem (BCH) ECC code, or a multidimensional parity ECC code to provide some examples, and/or convolutional codes, such as a low-density parity-check (LDPC) ECC code or a turbo ECC code to provide some examples, without departing from the spirit and scope of the present disclosure. Parity bit generator circuit 104 combines the R parity bits with the K information bits of input datastream 150 to provide output datastream 152 having K+R bits when operating in first direction 120.

Otherwise, parity bit generator circuit 104 separates input datastream 154 having K+R bits into K information bits and R parity bits when operating in second direction 122. Parity bit generator circuit 104 generates R' parity bits from the K information bits of input datastream 154 when operating in second direction 122 in accordance with the ECC. Parity bit generator circuit 104 provides the R' parity bits as output datastream 156. In an exemplary embodiment, parity bit generator circuit 104 also provides the R parity bits of input datastream 154 in the output datastream 156 to allow for a comparison of the R' parity bits generated by parity bit generator circuit 104 and the R parity bits of input datastream 154.

Exemplary Implementations for the Parity Bit Generator Module

Figure 2:
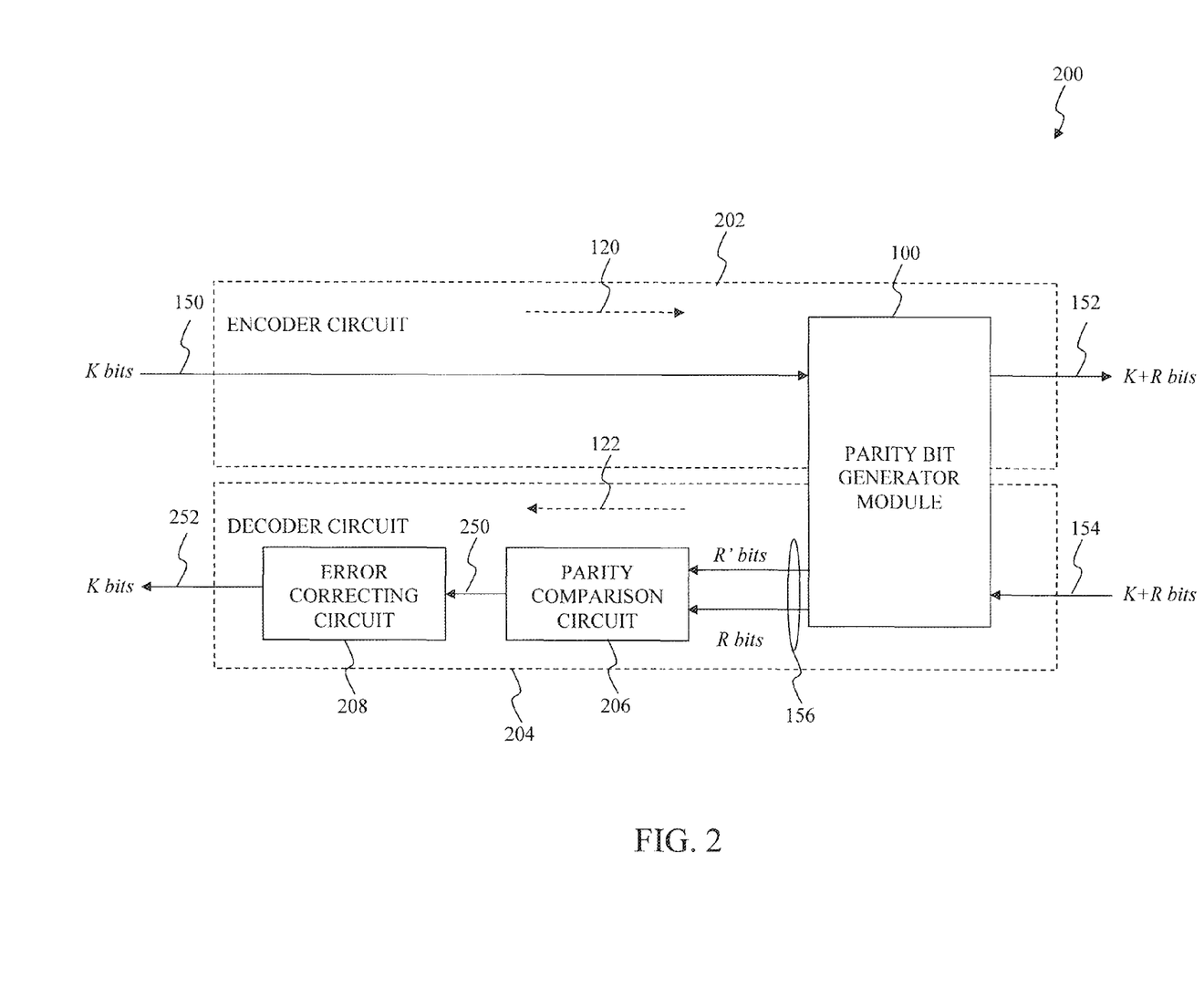
FIG. 2 is a block diagram of an encoding/decoding module having the parity bit generator module of FIG. 1 according to an exemplary embodiment of the present disclosure.
Figure 3:
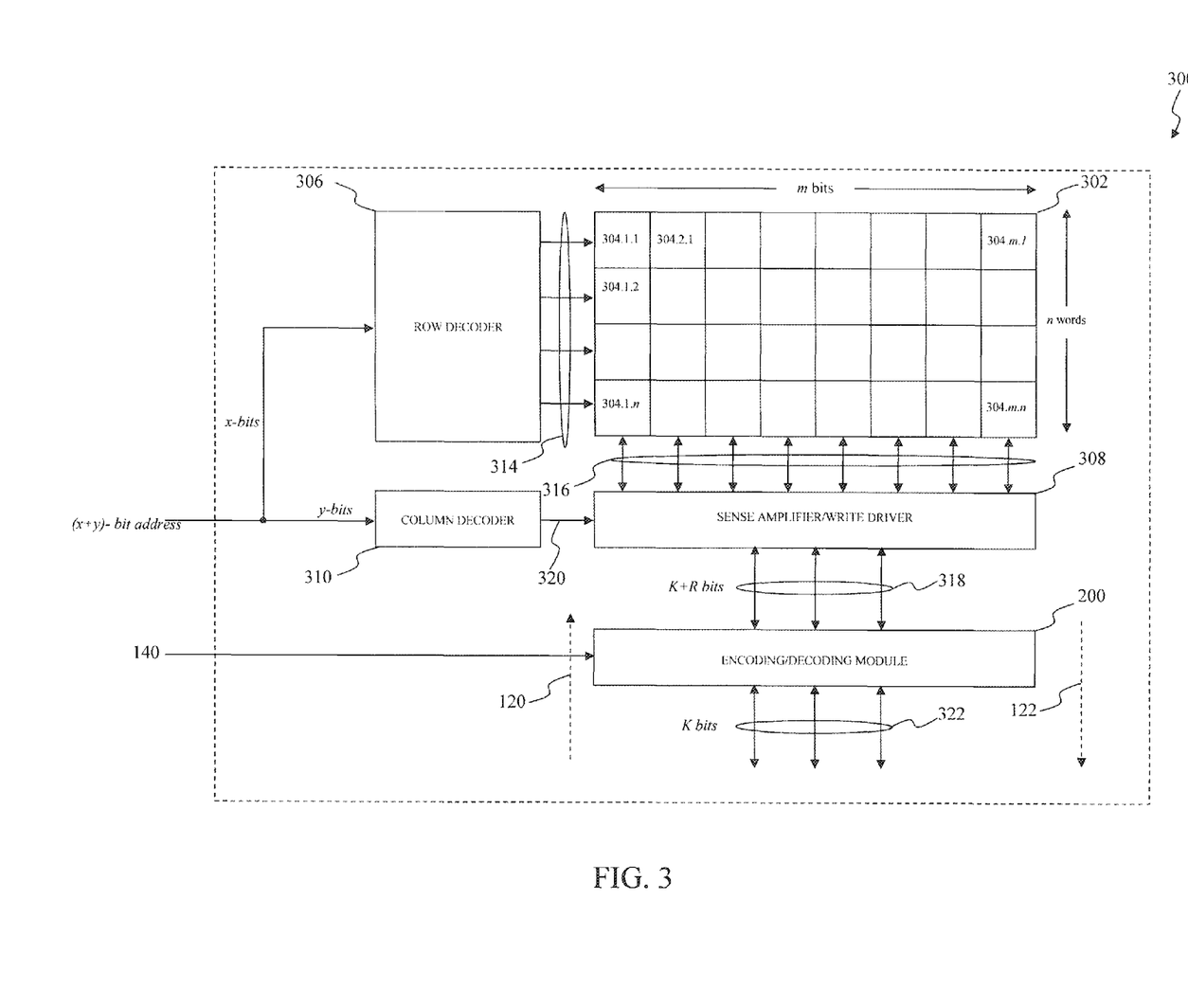
FIG. 3 is a block diagram of an ECC data storage device having the parity bit generator module of FIG. 1 according to an exemplary embodiment of the present disclosure.

The following description of FIG. 2 and FIG. 3 illustrate some exemplary embodiments for parity bit generator module 100. However, those of ordinary skill in the relevant art(s) will recognize that parity bit generator module 100 is implemented as part of other electronic circuits without departing from the spirit and scope of the present disclosure.

Exemplary Encoding/Decoding Module

FIG. 2 illustrates a block diagram of an encoding/decoding module having the parity bit generator module of FIG. 1 according to an exemplary embodiment of the present disclosure. As illustrated in FIG. 2, an encoding/decoding module 200 includes an encoder circuit 202 and a decoder circuit 204. When encoding/decoding module 200 is operating in first direction 120, encoder circuit 202 generates the R parity bits for input datastream 150 having the K information bits and combines these R parity bits with the K information bits of input datastream 150 to provide output datastream 152 having the K+R bits. Otherwise, decoder circuit 204 separates the K information bits from input datastream 154 having the K+R bits and generates the R' parity bits from the K information bits of input datastream 154 to provide output datastream 156 having the R' parity bits and the R parity bits of input datastream 154 when encoding/decoding module 200 is operating in second direction 122. Thereafter, decoder circuit 204 compares the R' parity bits and the R parity bits of input datastream 154 to determine whether the R' parity bits and the R parity bits of input datastream 154 differ indicating that the K information bits of input datastream 154 contains an error. The decoder circuit 204 corrects the error, when present, to provide an output datastream 252 having K error corrected information bits.

As illustrated in FIG. 2, encoder circuit 202 and decoder circuit 204 share parity bit generator module 100. Because a conventional encoder and a conventional decoder each include their own circuit for parity generation, the sharing of parity bit generator module 100 reduces the real estate needed to fabricate encoding/decoding module 200 on a semiconductor substrate by approximately twenty to approximately twenty-five percent when compared to the real estate needed to fabricate the conventional encoder and the conventional decoder on the semiconductor substrate.

As additionally illustrated in FIG. 2, decoder circuit 204 includes a parity comparison circuit 206 and an error correcting circuit 208. Parity comparison circuit 206 compares the R' parity bits generated by parity bit generator module 100 and the R parity bits of input datastream 154 to provide an error signal 250 indicating whether an error is present in the K information bits of input datastream 154. Error correction circuit 208 potentially detects which information bits from among the K information bits of input datastream 154 contain one or more errors and if possible correct the one or more errors in the K information bits of input datastream 154 to provide output datastream 252 having the K error corrected information bits. The manner of detecting and/or correcting the one or more errors in the K information bits of input datastream 154 is determined according to the ECC implemented within parity bit generator module 100. For example, when parity bit generator module 100 operates according to the Hamming (7,4) ECC code, error correction circuit 208 corrects any single-bit error in the four information bits of input datastream 154, or detects all single-bit and two-bit errors in the four information bits of input datastream 154.

Exemplary Error-Correcting Code (Ecc) Data Storage Device

FIG. 3 illustrates a block diagram of an ECC data storage device having the parity bit generator module of FIG. 1 according to an exemplary embodiment of the present disclosure. An ECC data storage device 300 operates in first direction 120 to write information to one or more memory cells that are configured to form an array of memory cells or in second direction 122 to read to information from the one or more memory cells. First direction 120 is referred to as a write mode of operation and second direction 122 is referred to as a read mode of operation. In an exemplary embodiment, the ECC data storage device 300 is implemented as a single port data storage device that operates in one of first direction 120 or second direction 122 at a time. In the read mode of operation, ECC data storage device 300 reads information from one or more memory cells corresponding to an (x+y)-bit address. Similarly, ECC data storage device 300 writes information to one or more memory cells corresponding to an (x+y)-bit address in the write mode of operation. ECC data storage device 300 can be implemented as volatile memory, such as random access memory (RAM), which requires power to maintain the information or non-volatile memory, such as read-only memory (ROM), which maintains the information even when not powered. The RAM can be implemented as dynamic random-access memory (DRAM), static random-access memory (SRAM), and/or non-volatile random-access memory (NVRAM), such as flash memory to provide an example. ECC data storage device 300 includes encoding/decoding module 200, a memory array 302, a row decoder 306, a sense amplifier/write driver 308, and a column decoder 310.

Memory array 302 includes memory cells 304.1.1 through 304.m.n that are arranged in an array of m columns and n rows. However, other arrangements for memory cells 304.1.1 through 304.m.n are possible without departing from the spirit and scope of the present disclosure. Each of memory cells 304.1.1 through 304.m.n is connected to a corresponding WL from among WLs 314.1 through 314.n and a corresponding BL from among BLs 316.1 through 316.m. In an exemplary embodiment, memory cells 304.1.1 through 304.m.n in each of the in columns of memory array 302 shares a common BL from among the BLs 316.1 through 316.m. Similarly, memory cells 304.1.1 through 304.m.n in each of n rows of memory array 302 share a common WL from among WLs 314.1 through 314.n. For example, as shown in FIG. 3, memory cells 304.1.1 through 304.m.1 of row 1 of memory array 302 share WL 314.1 and memory cells 304.m.1 through 304.m.n of column m of memory array 302 share BL 316.m.

To select a particular memory cell from among memory cells 304.1.1 through 304.m.n for a mode of operation, such as the read mode of operation or the write mode of operation, to provide some examples, the BL associated with the particular memory cell is selected, and the WL associated with this particular memory cell is selected. For example, BL 316.1 and WL 314.1 are selected to select memory cell 304.1.1. Thereafter, information is written into the selected memory cell in the write mode of operation, or information is read from the selected memory cell in the read mode of operation.

Each of WLs 314.1 through 314.n is selectively asserted by applying a corresponding x-bit row address from among a corresponding (x+y)-bit address to row decoder 306. An ECC data storage device controller, not shown in FIG. 3, can be used to provide the x-bit row address to the ECC data storage device 300. Row decoder 306 decodes the corresponding x-bit row address and provides one or more control signals to WLs 314.1 through 314.n that correspond to the x-bit row address to select a row of memory cells from among the memory cells 304.1.1 through 304.m.n. Similarly, each of BLs 316.1 through 316.m is selected by applying a corresponding y-bit column address from among the corresponding (x+y)-bit address to a column decoder 310. Column decoder 310 decodes the y-bit column address and provides one or more control signals 320 to sense amplifier/write driver 308 that correspond to the y-bit column address. Sense amplifier/write driver 308 selects a column of memory cells from among memory cells 304.1.1 through 304.m.n that corresponds to the y-bit column address.

Sense amplifier/write driver 308, using a sense amplifier, reads the information from a corresponding one or more BLs from among BLs 316.1 through 316.m that corresponds to a selected one or more memory cells from among memory cells 304.1.1 through 304.m.n during the read mode operation to provide K+R bits of information 318. In the read mode operation, information 318 can represent an exemplary embodiment of input datastream 154. Alternatively, sense amplifier/write driver 308, using a write driver, receives K+R bits of the information 318 and writes the K+R bits of information 318 to corresponding BLs from among BLs 316.1 through 316.m that corresponds to a selected memory cell from among memory cells 304.1.1 through 304.m.n during the write mode of operation. In the write mode operation, information 318 can represent an exemplary embodiment of output datastream 152.

Encoding/decoding module 200 generates R parity bits for K information bits of a datastream 322 and combines these R parity bits with the K information bits of datastream 322 to provide information 318 having the K+R bits when operating in the write mode of operation. In the write mode operation, the information 322 can represent an exemplary embodiment of input datastream 150. The ECC data storage device controller, not shown in FIG. 3, can be used to provide control signal 140 to ECC data storage device 300 to control operation of encoding/decoding module 200. Otherwise, encoding/decoding module 200 separates K information bits from information 318 having the K+R bits and generates the R' parity bits from the K information bits of the information when encoding/decoding module 200 is operating in the read mode of operation. Thereafter, encoding/decoding module 200 compares the R' parity bits and the R parity bits of information 318 to determine whether the R' parity bits and the R parity bits of information 318 differ indicating that the K information bits of information 318 contains an error. The encoding/decoding module 200 corrects the error, when present, to provide datastream 322 having K error corrected information bits. In the read mode operation, information 322 can represent an exemplary embodiment of output datastream 252.

Exemplary Operation of the Parity Bit Generator Module

Figure 4:
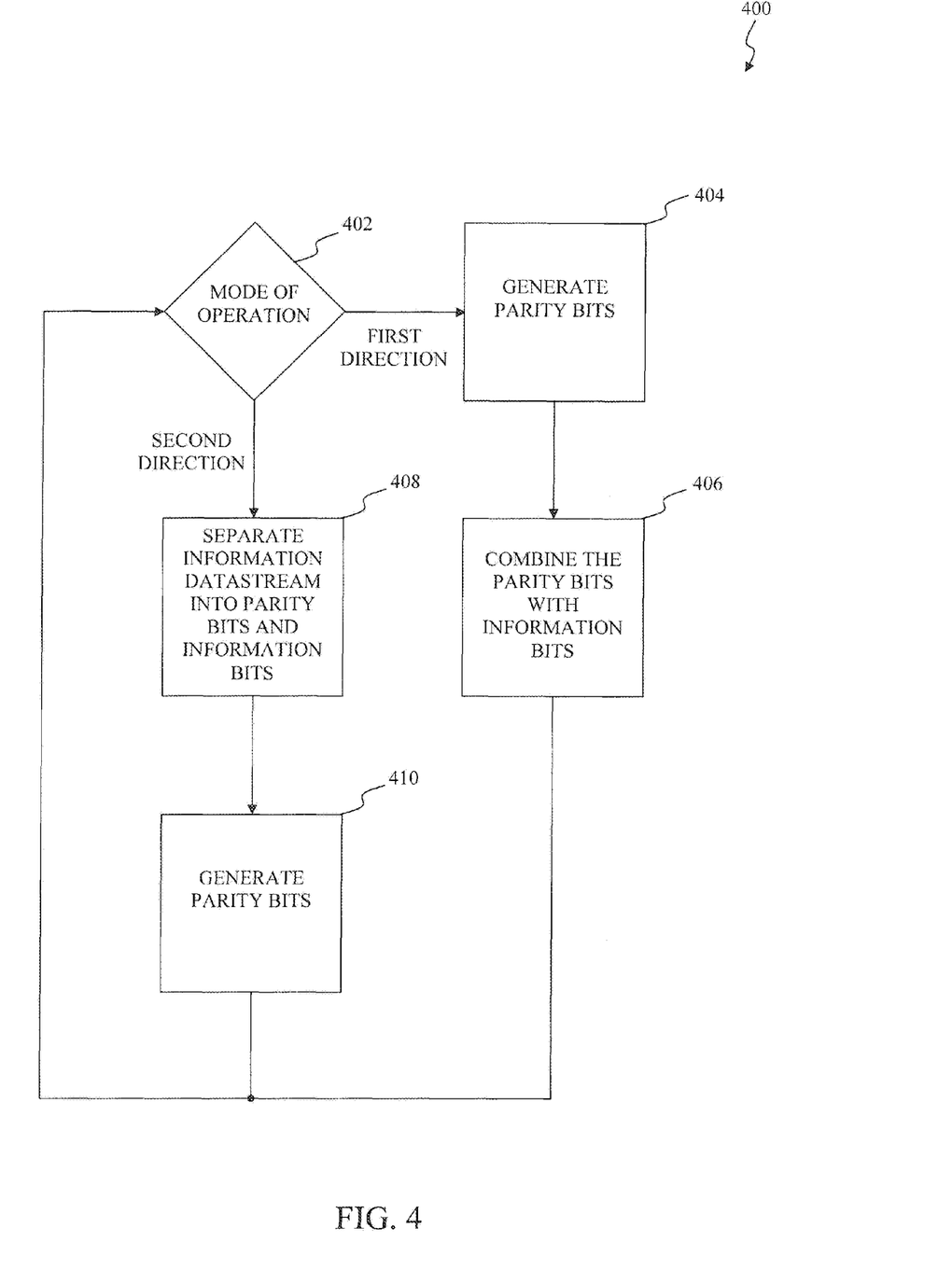
FIG. 4 is a flowchart of exemplary operational steps of the parity bit generator module of FIG. 1 according to an exemplary embodiment of the present disclosure.

FIG. 4 is a flowchart of exemplary operational steps of the parity bit generator module of FIG. 1 according to an exemplary embodiment of the present disclosure. The disclosure is not limited to this operational description. Rather, it will be apparent to ordinary persons skilled in the relevant art(s) that other operational control flows are within the scope and spirit of the present disclosure. The following discussion describes an exemplary operational control flow 400 of a parity bit generator module, such as the parity bit generator module 100 to provide an example.

At step 402, operational control flow 400 determines a mode of operation of the parity bit generator module. When the parity bit generator module is to operate in a first direction, such as first direction 120 to provide an example, operational control flow 400 proceeds to step 404. Otherwise, operational control flow 400 proceeds to step 408 when the parity bit generator module is to operate in a second direction, such as second direction 122 to provide an example. In an exemplary embodiment, step 402 includes toggling a switch, such as bi-directional switch 102 to provide an example, of the parity bit generator module to select between the first direction and the second direction.

At step 404, operational control flow 400 generates R parity bits for an input datastream, such as input datastream 150 to provide an example, having K information bits in accordance with an ECC, such as a Hamming ECC code to provide an example. However, those of ordinary skill in the relevant art(s) will recognize operational control flow 400 can use other block codes such as a Reed-Solomon ECC code, a Golay ECC code, a Bose, Chaudhuri, Hocquenghem (BCH) ECC code, or a multidimensional parity ECC code to provide some examples, and/or convolutional codes, such as a low-density parity-check (WPC) ECC code or a turbo ECC code to provide some examples, without departing from the spirit and scope of the present disclosure.

At step 406, operation control flow 400 combines the R parity bits from step 404 with the K information bits of the input datastream to provide an output datastream, such as the output datastream 152 to provide an example, having K±R bits. Thereafter, operational control flow 400 reverts to step 402.

At step 408, operation control flow 400 separates a second input datastream, such as input datastream 154 to provide an example, having K+R bits into K information bits and R parity bits.

At step 410, operation control flow 400 generates R parity bits from the K information bits of the second input datastream in accordance with the ECC of step 404 and provides the R' parity bits as a second output datastream, such as output datastream 156 to provide an example. In an exemplary embodiment, operation control flow 400 also provides the R parity bits of the second input datastream in the second output datastream to allow for a comparison of the R' parity bits from step 408 and the R parity bits of the second input datastream. Thereafter, operational control flow 400 reverts to step 402.

The foregoing Detailed Description discloses a parity bit generator module. The parity generator module includes a bi-directional switch that operates in a first direction or in a second direction. When the bi-directional switch operates in the first direction, a parity bit generator circuit of the parity generator module generates first parity bits for a first input datastream having first information bits and combines the first parity bits and the first information bits to provide a first output datastream having first information and parity bits. Otherwise, when the bi-directional switch operates in the second direction, the parity bit generator circuit separates second information bits from a second input datastream having second information and parity bits and generates second parity bits from the second information bits to provide a second output datastream having the second parity bits.

The foregoing Detailed Description also provides some exemplary embodiments for the parity bit generator module. A first exemplary embodiment for the parity bit generator module includes an encoding/decoding module having an encoder circuit and a decoder circuit. The encoder circuit generates first parity bits for a first input datastream having first information bits and combines the first parity bits with the first information bits to provide a first output datastream having first information and parity bits. The decoder circuit separates second information bits from a second input datastream having second information and parity bits, generates second parity bits from the second information bits, compares the second parity bits and parity bits from among the second information and parity bits to detect an error in the second information bits, and corrects the error to provide a second output datastream having error corrected information bits. In this first exemplary embodiment, the encoder circuit and the decoder circuit are configured to share the parity bit generator module.

A second exemplary embodiment for the parity bit generator module includes an ECC data storage device having a memory array and an encoding/decoding module. The encoding/decoding module generates first parity bits for a first input datastream having first information bits, combines the first parity bits with the first information bits to provide a first output datastream having first information and parity bits to the memory array in a write mode of operation, separates second information bits from a second input datastream, having second information and parity bits, received from the memory array in a read mode of operation, generates second parity bits from the second information bits, compares the second parity and parity bits from among the second information and parity bits to detect an error in the second information bits, and correct the error to provide a second output datastream having error corrected information bits. The encoding/decoding module includes a parity bit generator module that is operates in either the write mode of operation to generate the first parity bits or in the read mode of operation direction to generate the second parity bits.

The foregoing disclosure outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A parity bit generator module, comprising:
   a bi-directional switch configured to operate in a first direction or in a second direction; and
   a parity bit generator circuit configured to:
      generate first parity bits for a first input datastream having first information bits and to combine the first parity bits and the first information bits to provide a first output datastream having the first information bits and the first parity bits when a switching element is configured to operate in the first direction, and
      separate second information bits from a second input datastream having the second information bits and second parity bits and to generate third parity bits from the second information bits to provide a second output datastream having the third parity bits when the switching element is configured to operate in the second direction.

2. The parity bit generator module of claim 1, wherein the parity bit generator circuit is configured to generate the first parity bits and the third parity bits in accordance with an error-correcting code (ECC).

3. The parity bit generator module of claim 2, wherein the ECC comprises:
   a Hamming ECC.

4. The parity bit generator module of claim 1, wherein the parity bit generator circuit is configured to write the first output datastream to one or more memory cells from among a memory array when the switching element is configured to operate in the first direction and to read the second input datastream from the one or more memory cells when the switching element is configured to operate in the second direction.

5. The parity bit generator module of claim 1, wherein the bi-directional switch is further configured to receive a control signal, the control signal being at a first value to cause the bi-directional switch to operate in the first direction or at a second value to cause the bi-directional switch to operate in the second direction.

6. The parity bit generator module of claim 1, wherein the bi-directional switch is further configured to operate only in the first direction or only in the second direction.

7. An encoding/decoding module, comprising:
   an encoder circuit configured to:
      generate first parity bits for a first input datastream having first information bits, and
      combine the first parity bits with the first information bits to provide a first output datastream having the first information bits and the first parity bits; and
   a decoder circuit configured to:
      separate second information bits from a second input datastream having the second information bits and second parity bits,
      generate third parity bits from the second information bits,
      compare the second parity bits and the third parity bits to detect an error in the second information bits, and
      correct the error to provide a second output datastream having error corrected information bits,
   wherein the encoder circuit and the decoder circuit are configured to share a parity bit generator module, having a bi-directional switch and a parity bit generator circuit, that is configurable to operate in a first direction to generate the first parity bits or a second direction to generate the third parity bits, the bi-directional switch being configured to:
      provide the first information bits to the parity bit generator circuit in the first direction, or
      receive the third parity bits from the parity bit generator circuit in the second direction.

8. The encoding/decoding module of claim 7, wherein the decoder circuit comprises:
   a parity comparison circuit configured to compare the second parity bits and the third parity bits to provide an error signal indicating whether the error is present in the second information bits; and an error correcting circuit configured to:
  detect an information bit from among the second information bits that includes the error when the error signal indicates the error is present in the second information bits, and
  correct the information bit that includes the error to provide the second output datastream having the error corrected information bits.

9. The encoding/decoding module of claim 7, wherein the parity bit generator circuit is configured to:
  combine the first parity bits with the first information bits to provide the first output datastream having the first information bits and the first parity bits in the first direction,
  separate the second information bits from the second input datastream, and
  generate the third parity bits from the second information bits in the second direction.

10. The encoding/decoding module of claim 7, wherein the parity bit generator circuit is configured to generate the first parity bits and the third parity bits in accordance with an error-correcting code (ECC).

11. The encoding/decoding module of claim 10, wherein the ECC comprises:
  a Hamming ECC.

12. The encoding/decoding module of claim 7, wherein the encoder circuit is configured to write the first output datastream to one or more memory cells from among a memory array in the first direction, and
  wherein the decoder circuit is configured to read the second input datastream from the one or more memory cells in the second direction.

13. An error-correction code (ECC) data storage device, comprising:
  a memory array; and
  an encoding/decoding module configured to:
    generate first parity bits for a first input datastream having first information bits,
    combine the first parity bits with the first information bits to provide a first output datastream, having the first information bits and the first parity bits: to the memory array in a write mode of operation,
    separate second information bits from a second input datastream, having the second information bits and second parity bits, received from the memory array in a read mode of operation,
    generate third parity bits from the second information bits,
    compare the second parity bits and the third parity bits to detect an error in the second information bits, and
    correct the error to provide a second output datastream having error corrected information bits,
  wherein the encoding/decoding module comprises:
    a parity bit generator module that is configurable to operate in the write mode of operation to generate the first parity bits or in the read mode of operation to generate the third parity bits, the parity generator module comprising a bi-directional switch, coupled to a parity bit generator circuit, configured to:
      provide the first information bits to the parity bit generator circuit in the write mode of operation, or
      receive the third parity bits from the parity bit generator circuit in the read mode of operation.

14. The ECC data storage device of claim 13, wherein the memory array comprises:
  a plurality of memory cells arranged in an array of rows and columns, and further comprising:
    a row decoder configured to select a row from among the array of rows and columns in accordance with an address; and
    a column decoder configured to select a column from among the array of rows and columns in accordance with the address, and
  wherein the encoding/decoding module is configured to provide one or more bits of the first output datastream to a memory cell corresponding to the selected row and the selected column in the write mode of operation or to receive one or more bits of the second input datastream from the memory cell corresponding to the selected row and the selected column in the read mode of operation.

15. The ECC data storage device of claim 13, wherein the parity bit generator module is further configured to compare the second parity bits and the third parity bits to provide an error signal indicating whether the error is present in the second information bits; and wherein the encoding/decoding module comprises:
  an error correcting circuit configured to:
    detect an information bit from among the second information bits that includes the error when the error signal indicates the error is present in the second information bits, and
    correct the information bit that includes the error to provide the second output datastream having the error corrected information bits.

16. The ECC data storage device of claim 13, wherein the parity bit generator circuit is further configured to:
  combine the first parity bits with the first information bits to provide the first output datastream having the first information bits and the first parity bits in the write mode of operation, and
  separate the second information bits from the second input datastream having the second information bits and the second parity bits and to generate the third parity bits from the second information bits in the read mode of operation.

17. The ECC data storage device of claim 13, wherein the parity bit generator circuit is configured to generate the first parity bits and the third parity bits in accordance with an ECC.

18. The ECC data storage device of claim 17, wherein the ECC comprises:
  a Hamming ECC.

* * * * *

UNITED STATES PATENT AND TRADEMARK OFFICE
CERTIFICATE OF CORRECTION

PATENT NO. : 9,654,146 B2
APPLICATION NO. : 14/829059
DATED : May 16, 2017
INVENTOR(S) : Chen et al.

Page 1 of 1

It is certified that error appears in the above-identified patent and that said Letters Patent is hereby corrected as shown below:

In the Claims

In Column 9, Line 43, replace "bits:" with --bits,--.

Signed and Sealed this
Sixteenth Day of July, 2019

Andrei Iancu
*Director of the United States Patent and Trademark Office*